(12) United States Patent
Rad et al.

(10) Patent No.: US 10,496,218 B2
(45) Date of Patent: Dec. 3, 2019

(54) DISPLAY STACK WITH INTEGRATED FORCE INPUT SENSOR

(71) Applicant: Apple Inc., Cupertino, CA (US)

(72) Inventors: Mohammad Reza Esmaeili Rad, San Jose, CA (US); Shinya Ono, Cupertino, CA (US); Ting-Kuo Chang, San Jose, CA (US)

(73) Assignee: Apple Inc., Cupertino, CA (US)

( * ) Notice: Subject to any disclaimer, the term of this patent is extended or adjusted under 35 U.S.C. 154(b) by 151 days.

(21) Appl. No.: 15/662,003

(22) Filed: Jul. 27, 2017

(65) Prior Publication Data

US 2018/0224996 A1 Aug. 9, 2018

Related U.S. Application Data

(60) Provisional application No. 62/456,436, filed on Feb. 8, 2017.

(51) Int. Cl.
*G06F 3/041* (2006.01)
*G06F 3/046* (2006.01)
(Continued)

(52) U.S. Cl.
CPC ............ *G06F 3/0416* (2013.01); *G01B 7/18* (2013.01); *G06F 3/041* (2013.01); *G06F 3/045* (2013.01);
(Continued)

(58) Field of Classification Search
CPC ............ H01L 27/323; H01L 27/3276; H01L 51/5209; H01L 51/0096; H01L 51/5225;
(Continued)

(56) References Cited

U.S. PATENT DOCUMENTS 6,989,728 B2 1/2006 Van Zeeland et al.
7,504,905 B1 3/2009 Steinbrecher
(Continued)

FOREIGN PATENT DOCUMENTS

CN 101681719 3/2010
CN 102044915 5/2011
(Continued)

OTHER PUBLICATIONS

Bau, et al., "TeslaTouch: Electrovibration for Touch Surfaces," UIST'10, Oct. 3-6, 2010, New York, New York USA, 10 pages.
(Continued)

*Primary Examiner* — Muhammad N Edun
(74) *Attorney, Agent, or Firm* — Brownstein Hyatt Farber Schreck, LLP

(57) ABSTRACT

A force input sensor can include a strain-sensitive region disposed as a meandering electrical trace onto a structural or functional layer of a display stack. In particular, the meandering electrical trace can include one or more diversions from a linear path, each diversion configured to increase the length of the electrical trace. A diversion can form a loop to increase the inductance of the meandering electrical trace; the inductance of the meandering electrical trace can be correlated to length of the inductive trace which, in turn, can be correlated to strain experienced by the structural or functional layer.

20 Claims, 11 Drawing Sheets

(51) Int. Cl.
*G06F 3/045* (2006.01)
*H01L 27/32* (2006.01)
*H01L 51/52* (2006.01)
*H01L 51/00* (2006.01)
*H01L 51/56* (2006.01)
*G01B 7/16* (2006.01)

(52) U.S. Cl.
CPC ............ *G06F 3/046* (2013.01); *H01L 27/323* (2013.01); *H01L 27/3276* (2013.01); *H01L 51/0096* (2013.01); *H01L 51/5209* (2013.01); *H01L 51/56* (2013.01); *G06F 2203/04102* (2013.01); *H01L 51/5225* (2013.01); *H01L 2227/323* (2013.01)

(58) Field of Classification Search
CPC ... H01L 51/56; H01L 2227/323; G06F 3/041; G06F 3/0416; G06F 3/045; G06F 3/046; G06F 2203/04102; G01B 7/18
See application file for complete search history.

(56) References Cited

U.S. PATENT DOCUMENTS

| | | | |
|---|---|---|---|
| 7,812,268 B2 | 10/2010 | Ely et al. | |
| 7,948,208 B2 | 5/2011 | Partovi et al. | |
| 7,952,322 B2 | 5/2011 | Partovi et al. | |
| 8,169,185 B2 | 5/2012 | Partovi et al. | |
| 8,547,350 B2 | 10/2013 | Anglin et al. | |
| 8,629,652 B2 | 1/2014 | Partovi et al. | |
| 8,629,654 B2 | 1/2014 | Partovi et al. | |
| 8,890,470 B2 | 11/2014 | Partovi | |
| 8,896,264 B2 | 11/2014 | Partovi | |
| 8,901,881 B2 | 12/2014 | Partovi | |
| 8,917,362 B2 | 12/2014 | Wang et al. | |
| 8,922,502 B2 | 12/2014 | Ciesla et al. | |
| 8,947,047 B2 | 2/2015 | Partovi et al. | |
| 9,013,442 B2 | 4/2015 | Hotelling et al. | |
| 9,030,289 B2 | 5/2015 | Lai | |
| 9,106,083 B2 | 8/2015 | Partovi | |
| 9,112,362 B2 | 8/2015 | Partovi | |
| 9,112,363 B2 | 8/2015 | Partovi | |
| 9,112,364 B2 | 8/2015 | Partovi | |
| 9,178,369 B2 | 11/2015 | Partovi | |
| 9,276,437 B2 | 3/2016 | Partovi et al. | |
| 9,356,659 B2 | 5/2016 | Partovi | |
| 9,508,487 B2 | 11/2016 | Von Novak et al. | |
| 9,760,209 B2* | 9/2017 | Moon ..................... | G06F 3/044 |
| 2007/0272919 A1 | 11/2007 | Mori et al. | |
| 2011/0050164 A1 | 3/2011 | Partovi et al. | |
| 2011/0221385 A1 | 9/2011 | Partovi et al. | |
| 2012/0038577 A1 | 2/2012 | Brown et al. | |
| 2012/0086669 A1 | 4/2012 | Kim et al. | |
| 2012/0313863 A1 | 12/2012 | Hsu | |
| 2013/0093388 A1 | 4/2013 | Partovi | |
| 2013/0099563 A1 | 4/2013 | Partovi et al. | |
| 2013/0260677 A1 | 10/2013 | Partovi | |
| 2013/0271069 A1 | 10/2013 | Partovi | |
| 2013/0285604 A1 | 10/2013 | Partovi | |
| 2013/0285605 A1 | 10/2013 | Partovi | |
| 2013/0300204 A1 | 11/2013 | Partovi | |
| 2014/0085247 A1 | 3/2014 | Leung et al. | |
| 2014/0103873 A1 | 4/2014 | Partovi et al. | |
| 2014/0132210 A1 | 5/2014 | Partovi | |
| 2014/0145734 A1 | 5/2014 | Lin et al. | |
| 2014/0191568 A1 | 7/2014 | Partovi | |
| 2014/0306654 A1 | 10/2014 | Partovi | |
| 2015/0130412 A1 | 5/2015 | Partovi | |
| 2015/0349539 A1 | 12/2015 | Moyer et al. | |
| 2015/0380355 A1* | 12/2015 | Rogers ................. | H01L 23/538 257/773 |
| 2016/0293884 A1* | 10/2016 | Zhang ................ | H05B 33/0896 |
| 2017/0075493 A1* | 3/2017 | Lee ....................... | G06F 3/0418 |
| 2017/0308212 A1* | 10/2017 | Jin ........................ | G06F 3/0412 |
| 2017/0358637 A1* | 12/2017 | Lee ..................... | H01L 27/3251 |

FOREIGN PATENT DOCUMENTS

| | | |
|---|---|---|
| CN | 102801218 | 11/2012 |
| CN | 102959830 | 3/2013 |
| CN | 103493334 | 1/2014 |
| CN | 103827997 | 5/2014 |
| CN | 204967433 | 1/2016 |
| EP | 2528185 | 11/2012 |
| JP | 2008236968 | 10/2008 |

OTHER PUBLICATIONS

Feist, "Samsung snags patent for new pressure sensitive touchscreens," posted on AndroidAuthority.com at URL: http://www.androidauthority.com/samsung-patent-pressure-sensitive-touchscreens-354860, Mar. 7, 2014, 1 page.

* cited by examiner

DISPLAY STACK WITH INTEGRATED FORCE INPUT SENSOR

CROSS-REFERENCE TO RELATED APPLICATIONS

This application claims the benefit under 35 U.S.C. § 119(e) of U.S. Provisional Patent Application No. 62/456,436, filed on Feb. 8, 2017, and entitled "Display Stack with Integrated Force Input Sensor," the contents of which is incorporated by reference as if fully disclosed herein.

FIELD

Embodiments described herein relate to electronic displays and, in particular, to electronic display stacks that integrate force input sensors.

BACKGROUND

An electronic display typically comprises a stack of layers (generally referred to as a "display stack") positioned behind a transparent, protective cover. In some cases, an input sensor is positioned relative to the display stack or the cover and can be configured to detect when a user applies a force to the cover at one or more locations. Output from the sensor can be used to interact with content shown on the display, or for any other suitable purpose. Such sensors—when operated with the display—can be referred to as "force input sensors."

A force input sensor is conventionally positioned between the display stack and the protective cover, behind the display stack, or around a perimeter of the display stack. In these conventional configurations, the force input sensor contributes to an undesirable increase in thickness and/or weight of an electronic device incorporating the sensor. In addition, these conventional configurations typically require the sensor to be manufactured from a limited set of specific materials having specific properties, such as highly-conductive materials that are also optically transparent. Further still, many conventional force input sensors are substantially affected by changes in temperature; advanced signal processing may be required to obtain accurate force input information from conventional sensors.

SUMMARY

Embodiments described herein relate to, include, or take the form of a display stack, such as an organic light-emitting diode display stack, that includes at least one structural (or functional) layer generally referred to as a substrate. The substrate can accommodate one or more organic light-emitting diode pixels (or subpixels), each of which can be associated with at least one conductive element, such as an anode or a cathode. Typically, the conductive element is formed onto (or otherwise disposed onto) the substrate. The display stack also includes an electrical trace, also disposed on the substrate. The electrical trace circumscribes the anode to form an inductor. The electrical trace is configured to couple to a force input sensor that, in turn, is configured to measure one or more electrical properties of the electrical trace that correspond to physical deformations of that trace. In many cases, the electrical property measured by the force input sensor is inductance, although this may not be required and certain embodiments can be associated with force input sensors configured to measure resistance, reactance, and/or capacitance.

Other embodiments described herein generally reference method for detecting force input with a display. The method includes the operations of: deactivating a pixel; causing a conductive element (e.g., cathode, anode, thin-film transistor, and so on) associated with the pixel to float with respect to a system ground; applying a drive signal to an input lead of an electrical trace at least partially circumscribing the conductive element; measuring an electrical property of the electrical trace based on a sense signal received from an output lead of the electrical trace; correlating the measurement of the electrical property to a strain experienced by the electrical trace; and correlating the strain to an input force applied to the display.

BRIEF DESCRIPTION OF THE DRAWINGS

Reference will now be made to representative embodiments illustrated in the accompanying figures. It should be understood that the following descriptions are not intended to limit this disclosure to one preferred embodiment. To the contrary, the disclosure provided herein is intended to cover alternatives, modifications, and equivalents as may be included within the spirit and scope of the described embodiments, and as defined by the appended claims.

The use of the same or similar reference numerals in different figures indicates similar, related, or identical items.

Figure 1A:
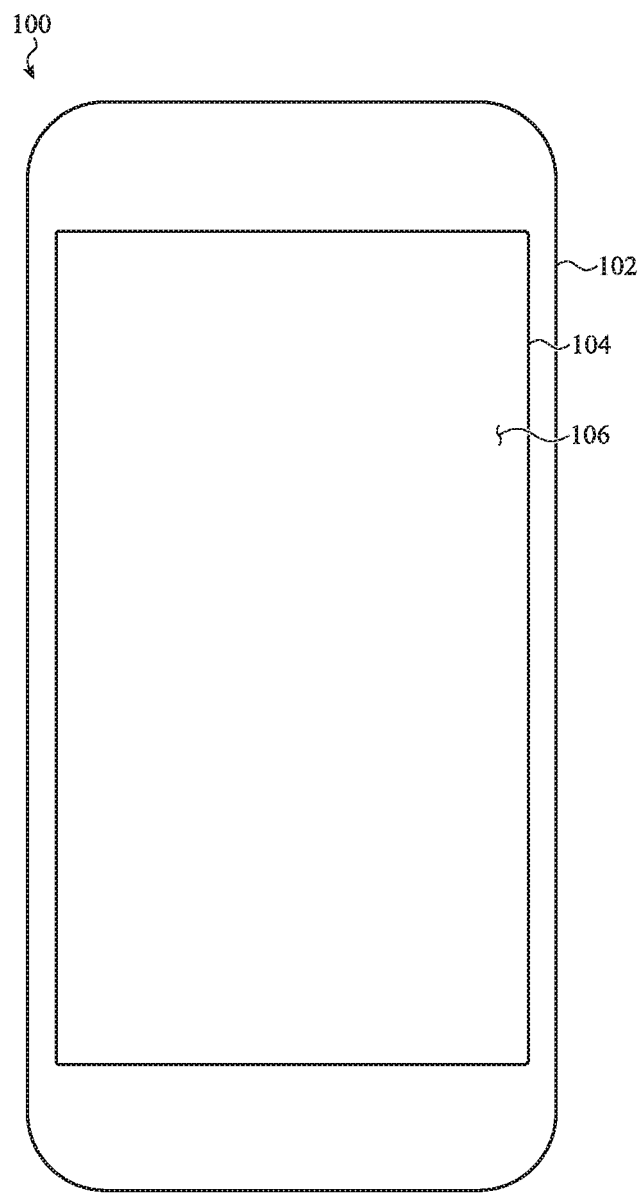
FIG. 1A depicts an electronic device that can incorporate a display stack-integrated force input sensor.

Additionally, it should be understood that the proportions and dimensions (either relative or absolute) of the various features and elements (and collections and groupings thereof) and the boundaries, separations, and positional relationships presented therebetween, are provided in the accompanying figures merely to facilitate an understanding of the various embodiments described herein and, accordingly, may not necessarily be presented or illustrated to scale, and are not intended to indicate any preference or requirement for an illustrated embodiment to the exclusion of embodiments described with reference thereto.

DETAILED DESCRIPTION

Embodiments described herein reference a force input sensor integrated into an active display area of a display stack. This configuration reduces thickness and weight of an electronic device incorporating the display stack.

In particular, in many embodiments, the force input sensor includes at least one strain-sensitive structure disposed as a meandering electrical trace onto a structural layer or a functional layer of an active display area of a display stack. In this configuration, when an input force is applied to the display stack, the meandering electrical trace is mechanically strained, causing one or more measurable electrical properties (e.g., resistance, inductance, reactance, capacitance, and so on) of the trace to change. In addition, the force input sensor typically includes—or is in communication with—one or more controllers, processors, or circuits that correlate a measurement of the electrical property(s) of the meandering electrical trace to a magnitude of the input force applied to the display stack. The magnitude of the input force can be received as user input by an electronic device incorporating the display stack.

In many embodiments, a force input sensor includes a strain-sensitive structure, disposed as a meandering electrical trace onto a structural layer or a functional layer of a display stack. In many cases, multiple strain-sensitive structures can be disposed in a regular pattern onto the same structural layer or functional layer of the display stack, although this may not be required. For example, in some embodiments, a first pattern of strain-sensitive structures can be disposed onto a first layer of the display stack and a second pattern of strain-sensitive structures can be disposed onto a second layer of the same display stack. The first and second patterns of strain-sensitive structures may overlap and/or align, but this may not be required.

For simplicity of the description that follows, many embodiments reference a force input sensor that includes a number of strain-sensitive structures distributed as a grid of meandering electrical traces that each follow a serpentine pattern. However, it may be appreciated that this configuration is merely one example; additional or alternative meandering electrical trace patterns and strain-sensitive structure distribution patterns may be associated with force input sensors of other suitable implementations.

For example, meandering electrical trace patterns can include, but are not limited to: vertically-aligned serpentine patterns, horizontally-aligned serpentine patterns, angled serpentine patterns, spiral patterns, double-back spiral patterns, interdigitated serpentine patterns, comb patterns, rectilinear patterns, curved patterns, polygonal patterns, and so on, or any combination thereof. Distribution patterns of strain-sensitive structures—for embodiments of force input sensors including more than one strain-sensitive structure— can include, but may not be limited to: regular patterns, irregular patterns, tessellated patterns, repeating patterns, multi-layer patterns, single-layer patterns, and so on. Individual meandering electrical traces of a particular distribution can be the same size or different sizes and may have the same or different meandering trace patterns.

Additionally, it is understood that strain-sensitive structures of a force input sensor, such as described herein, can be incorporated into any suitable display stack. For example, in one embodiment, a strain-sensitive structure can be integrated into a liquid crystal display stack (herein, "LCD stack"), which may include multiple structural layers and/or multiple functional layers. Such layers include, but may not be limited to: a polarizer layer, a thin-film transistor layer, a color filter layer, a liquid crystal layer, a backlight layer, a quantum dot backlight layer, a reflector layer, and so on. A strain-sensitive structure can be formed onto or into any suitable layer of the LCD stack. For example, a strain-sensitive structure can be disposed as a meandering electrical trace on a color filter layer of an LCD stack. The meandering electrical trace can traverse an area between individual pixels (or subpixels) of the LCD stack. In other cases, the meandering electrical trace can be optically transparent and can be disposed across (or over) one or more pixels or subpixels of the LCD stack.

In another example, a strain-sensitive structure can be integrated into an organic light-emitting diode display stack (herein, "OLED display stack"). The OLED display stack can include multiple structural layers and/or functional layers, each of which can accommodate one or more strain-sensitive structures distributed in an implementation-specific pattern. Such layers can include, but may not be limited to: an anode layer, a cathode layer, an organic layer, an encapsulation layer, a reflector layer, a stiffening layer, an injection layer, a transport layer, a polarizer layer, an anti-reflective layer, and so on. In one example, a grid of strain-sensitive structures associated with the force input sensor can be disposed as a grid of meandering electrical traces on the anode layer of the OLED display stack, between and/or around individual anodes of individual pixels or subpixels. In some cases, the grid of strain-sensitive structures occupies substantially the entire active display area of the OLED display stack, although this may not be required of all embodiments.

In operation, a drive controller—which can be a circuit, processor, or otherwise configured—associated with the force input sensor applies an electrical signal (or, more generally herein, a "drive signal") to an input lead of a selected meandering electrical trace. In some cases, the drive controller is configured to apply a drive signal to more than one meandering electrical trace simultaneously; the drive signals applied to different meandering electrical traces can be identical, different, in-phase, out-of-phase, or otherwise configured. In some embodiments, the drive controller is electrically coupled to (or additionally configured to operate as) a state controller adapted to determine whether a particular meandering electrical trace (or set of meandering electrical traces) should receive a drive signal at a particular time. In one embodiment, the state controller is coupled to a touch input sensor adapted to detect one or more user touch locations relative to an active display area of the display stack. In this example, the state controller may enable the drive controller to apply a drive signal to only those meandering electrical traces adjacent to detected touch locations.

The drive signal can include a direct current bias and/or may include one or more alternating current frequency components. The drive signal can have any suitable band width and may vary from embodiment to embodiment or measurement to measurement. For example, in some cases, a first drive signal applied to an input lead of a first meandering electrical trace may have higher peak amplitude than a second drive signal applied to an input lead of a second meandering trace. In other cases, one or more characteristics of a drive signal can be determined from or informed by one or more power requirements or limitations of an electronic device incorporating the display stack and the force input sensor.

In other cases, one or more characteristics of a drive signal can be determined from or informed by one or more force input sensitivity or accuracy requirements, limitations, or thresholds of an electronic device incorporating the display stack and the force input sensor. In still other cases, one or more characteristics of a drive signal can be determined from or informed by one or more user or system settings, user or system profiles or configurations, executing or idling applications or operating system functions of an electronic device incorporating the display stack and the force input sensor. A drive signal can have varying or fixed frequency, varying or fixed amplitude, varying or fixed direct current bias, varying or fixed phase, and so on.

After applying the drive signal to at least one meandering electrical trace, the force input sensor can receive or obtain a sense signal from an output lead of the meandering electrical trace. The force input sensor can analyze or otherwise process the sense signal to quantify an electrical property of the trace (e.g., inductance, reactance, resistance, capacitance, and so on) that corresponds to one or more physical dimensions of that trace, such as, but not limited to length, width, or area. For example, the meandering electrical trace can be formed from peizoresistive material that exhibits a change in resistance proportional to a change in length. In other cases, the meandering electrical trace can exhibit a change in inductance as a function of the length or area. In still other cases, the meandering electrical trace can exhibit a change in reactance as a function of the length or area. After determining and/or quantifying the electrical property of the trace, the force input sensor can correlate that measurement or quantity to a magnitude of strain experienced by the layer accommodating the trace. Thereafter, the force input sensor can correlate the strain experienced by the layer to an input force applied to the display stack.

For simplicity of description, many embodiments that follow reference a force input sensor including a number of strain-sensitive structures, disposed as a grid of independent meandering electrical traces on an anode layer of an OLED display stack incorporated into a portable electronic device. However, it is appreciated that this is merely one example configuration; a force input sensor, such as described herein, can be accommodated on any suitable layer of any suitable display stack or display stack technology (e.g., common segment displays, light emitting diode displays, liquid crystal displays, plasma displays, projection displays, electronic paper displays, organic light-emitting diode displays, and so on). Similarly, any number of suitable electronic devices can incorporate a display stack-integrated force input sensor such as described herein; suitable electronic devices can include, but may not be limited to: portable electronic devices (e.g., battery-powered, wirelessly-powered devices, tethered devices, and so on); stationary electronic devices; control devices (e.g., home automation devices, industrial automation devices, aeronautical or terrestrial vehicle control devices, and so on); personal computing devices (e.g., cellular devices, tablet devices, laptop devices, desktop devices, and so on); wearable devices (e.g., implanted devices, wrist-worn devices, eyeglass devices, and so on); and so on.

Further, it may be appreciated that other sensors or electrical circuits, beyond (or in addition to) meandering electrical traces or strain-sensitive structures of force input sensors, may be incorporated into display stacks using the techniques, constructions, and/or methods described herein. Such alternative or additional circuits or sensors may include, but may not be limited to: power circuits (both wireless and wired), environmental sensors, touch input sensors, communications circuits, antennas, biometric imaging or authentication circuits, imaging circuits, light-sensitive or emissive circuits, acoustic circuits, interposer or coupling circuits, and so on.

In addition, for simplicity of description, the term "pixel" as used herein is generally understood to be interchangeable with the term "subpixel."

These and other embodiments are discussed below with reference to FIGS. 1A-12. However, those skilled in the art will readily appreciate that the detailed description given herein with respect to these figures is for explanation only and should not be construed as limiting.

FIG. 1A shows an electronic device 100 that can include a display stack-integrated force input sensor. The electronic device 100 includes a housing 102 to retain, support, and/or enclose various components of the electronic device 100, such as a display 104. The display 104 may include a stack of multiple layers (e.g., a display stack) including, for example, and in no particular order: an organic light emitting diode layer, a touch input layer, a force input layer, and so on. Other embodiments can implement the display 104 in a different manner, such as with liquid crystal display technology, electronic ink technology, quantum dot technology, and so on.

The display 104 can be a planar display, wrap-around display, a bezel-less display, a curved display, a rectilinear display, or any other suitable display. In some cases, the display 104 is flexible.

In many embodiments, the display 104 is positioned behind a protective outer layer that defines an input surface 106 above an active display area of the display 104. The active display area of the display 104 is typically characterized by a distribution of individually-controllable pixels or pixel elements.

The various layers of the display 104, regardless of the implementation-specific display technology selected for a particular embodiment, may be adhered together with an optically transparent adhesive and/or may be supported by a common frame such that the layers abut one another. A common frame may extend around a perimeter, or a portion of the perimeter, of the layers, may be segmented around the perimeter, a portion of the perimeter, or may be coupled to the various layers of the display 104 in another manner.

The common frame can be made from any suitable material such as, but not limited to: metal, plastic, ceramic, acrylic, and so on. The common frame may be a multipurpose component serving an additional function such as, but not limited to: providing an environmental and/or hermetic seal to one or more components of the display 104 or the electronic device 100; providing structural support to the housing 102; providing pressure relief to one or more components of the display 104 or the electronic device 100; providing and defining gaps between one or more layers of the display 104 for thermal venting and/or to permit flexing of the layers in response to a force applied to the input surface 106; and so on.

In some embodiments, the layers of the display 104 may be attached or deposited onto separate substrates that may be laminated or bonded to each other or otherwise encapsulated into a single package. The display 104 may also include, or can be positioned adjacent to, other layers suitable for improving the structural or optical performance of the display 104. Additionally, the display 104 may include or integrate a touch sensor (not shown) for determining the location of one or more touches on the input surface 106 of the electronic device 100. In many examples, the touch sensor is a capacitive touch sensor configured to detect the location and/or area of one or more touches of a user's finger and/or a passive or active stylus relative to the active display area of the display 104 on the input surface 106.

The electronic device 100 can also include a processor, memory, power supply and/or battery, network connections, sensors, input/output ports, acoustic elements, haptic elements, digital and/or analog circuits for performing and/or coordinating tasks of the electronic device 100, and so on. For simplicity of illustration, the electronic device 100 is depicted in FIG. 1A without many of these elements, each of which may be included, partially and/or entirely, within the housing 102 and may be operationally or functionally associated with, or coupled to, the display 104.

Furthermore, although illustrated as a hand-held cellular phone, the electronic device 100 can be another electronic device that is either stationary or portable, taking a larger or smaller form factor than illustrated. For example, in certain embodiments (and as noted above), the electronic device 100 can be a laptop computer, a tablet computer, a cellular phone, a wearable device, a health monitoring device, a home or building automation device, a home or building appliance, a craft or vehicle entertainment, control, and/or information system, a navigation device, and so on.

Figure 1B:
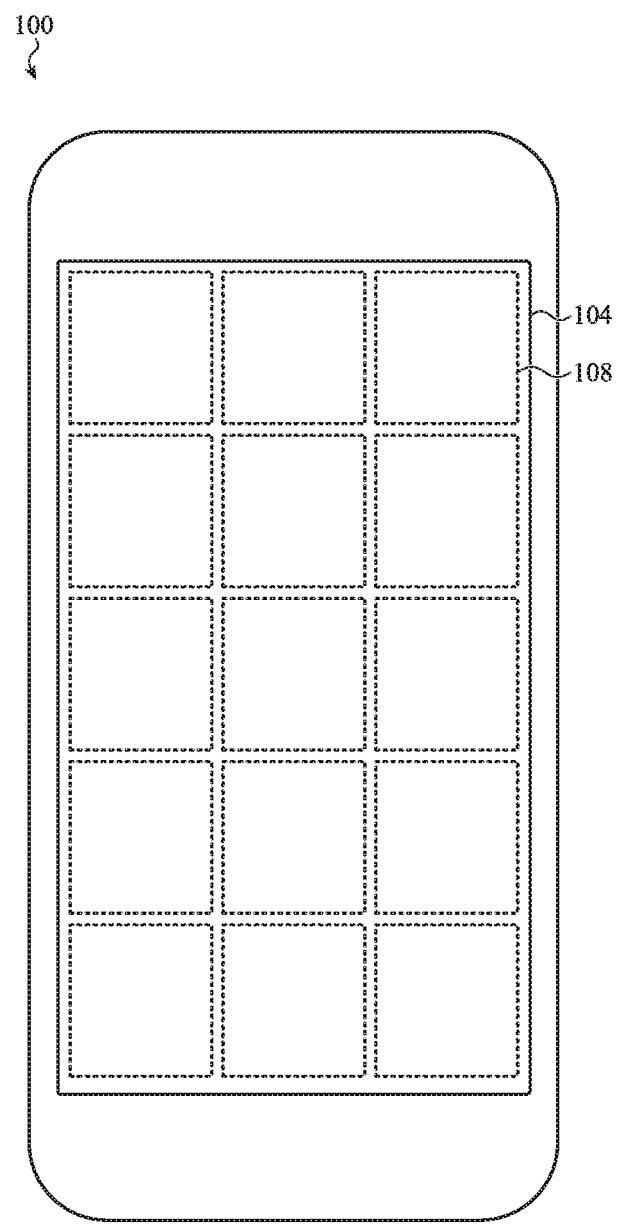
FIG. 1B depicts the electronic device of FIG. 1A, specifically depicting an array of strain-sensitive structures of the display stack-integrated force input sensor.

As noted above, a grid of strain-sensitive structures associated with a force input sensor of the electronic device 100 can be incorporated into or otherwise accommodated by one or more layers of the display stack of the display 104. For example, FIG. 1B shows a grid of strain-sensitive structures, one of which is identified as the strain sensitive structure 108, distributed in a grid pattern below the input surface 106. In one example, the grid of strain-sensitive structures is accommodated on a structural layer of the display stack of the display 104. In another example, a first subset of the grid of strain-sensitive structures is accommodated on a first layer (e.g., a structural layer) and a second subset of the grid of strain-sensitive structures is accommodated on a second layer (e.g., a functional layer). In some cases, the strain-sensitive structure 108 can be aligned with another strain-sensitive structure (not shown) that is either above or below the strain-sensitives structure 108 relative to the input surface 106.

Accordingly, it may be appreciated that, as noted with respect to other embodiments described herein, the grid of strain-sensitive structures can be distributed in any other suitable manner, across the a portion of or the entirety of the active display area of the display 104.

The force input sensor of the electronic device 100, integrated (at least partially) into the display stack of the display 104, is typically associated with at least one electrical circuit (not shown). The electrical circuit can include both drive circuitry and/or sense circuitry. The drive circuity (or, more generally, the "drive controller") may be used to apply a drive signal to an input lead of one or more strain-sensitive structures of the grid of strain-sensitive structures and the sense circuitry may be used to receive a sense signal from an output lead of the strain sensitive structures. The sense signal can be used to detect changes in voltage, current, or another electrical property of the strain-sensitive structures of the grid of strain-sensitive structures that changes in a manner that can be correlated to a strain experienced by the associated layer of the display stack. In many cases, both the drive circuitry and the sense circuitry can include one or more signal processing stages which can include, but are not limited to, amplifying stages, filtering stages, multiplexing stages, digital-to-analog conversion stages, analog-to-digital conversion stages, comparison stages, feedback stages, and so on.

The force input sensor of the electronic device 100 can also include a state controller configured to determine which, if any, of the strain-sensitive structures of the grid of strain-sensitive structures to drive at any given time. The state controller can be implemented in any number of suitable ways; in many embodiments, the state controller includes at least one processor in communication with a processor of the electronic device 100.

In some embodiments, the state controller is in communication with a touch sensor (not shown) associated with the input surface 106 or the display 104, although this may not be required. The state controller can use information from the touch sensor to modulate, regulate, and/or control the power delivered to or consumed by one or more of the strain-sensitive structures of the grid of strain-sensitive structures.

Generally and broadly, FIGS. 2A-3C depict different constructions of a strain-sensitive element (or a portion thereof) of a force input sensor that can be integrated into a display stack. As with other embodiments described herein, the strain-sensitive element is typically disposed on a structural or functional layer of the display stack as a meandering electrical trace.

In many cases, the meandering electrical trace generally follows a serpentine pattern, but this may not be required. For example, other suitable patterns can include, but are not limited to: vertically-aligned serpentine patterns, angled serpentine patterns, spiral patterns, double-back spiral patterns, interdigitated serpentine patterns, comb patterns, rectilinear patterns, curved patterns, quadrant-specific patterns, angular section-specific patterns, polygonal patterns, and so on, or any combination thereof.

In addition to following a patterned path, the meandering electrical trace can also turn, loop back, or otherwise divert from the pattern. In many cases, such "diversions" are configured to increase the length of the meandering electrical trace, which, in turn, can affect one or more electrical properties of that trace. For example, the longer the meandering electrical trace is (the greater the number of diversions), the greater the impedance and/or resistance exhibited by that trace. In another example, a meandering electrical trace can include one or more diversions that each form a substantially closed loop (e.g., an inductor have one turn), thereby increasing the impedance exhibited by the trace.

Figure 2A:
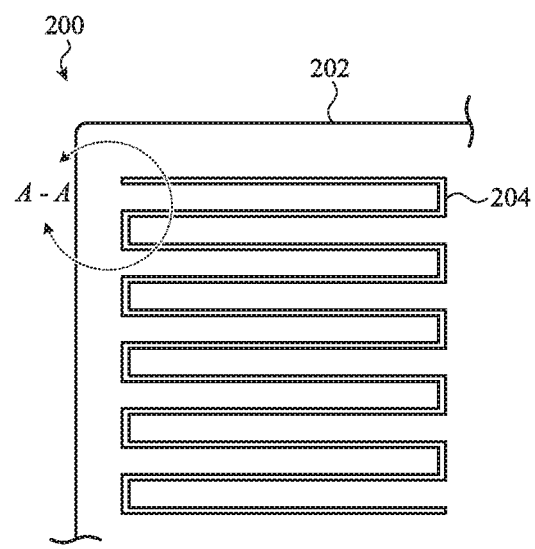
FIG. 2A depicts a detailed view of a strain-sensitive structure of an example display stack-integrated force input sensor, such as described herein.

FIG. 2A depicts a detailed view of a strain-sensitive structure of an example display stack-integrated force input sensor, such as described herein. In particular, the strain-sensitive structure is formed as a meandering electrical trace onto a layer of the display stack 200.

The specific layer (or layers) of the display stack 200 accommodating the meandering electrical trace can vary from embodiment to embodiment. For example, in one embodiment, the display stack 200 is an OLED display stack and the meandering electrical trace is disposed onto an anode layer, a cathode layer, a reflector layer, or any other suitable layer of the OLED display stack. In another embodiment, the display stack 200 is an LED display stack and the meandering electrical trace is disposed onto a polarizer layer, a backlight layer, a color filter layer, or any other suitable layer of the LED display stack.

Figure 2B:
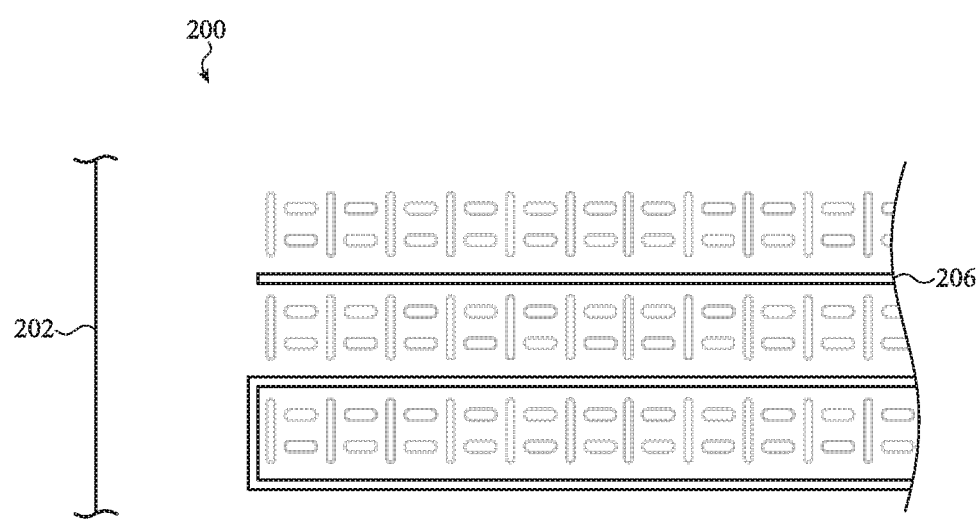
FIG. 2B depicts a detail view of the enclosed circle A-A of FIG. 2A, specifically showing a strain-sensitive electrical trace traversing a region between individual pixel rows of a display, such as described herein.

For simplicity of description, the embodiment depicted in FIGS. 2A-2B references a shared layer 202 onto which a meandering electrical trace 204 is disposed; it is appreciated that the shared layer 202 can be any suitable layer of any suitable display stack. As a result of this construction (and as noted with respect to other embodiments described herein) when an input force is applied to the display stack 200, the shared layer 202 and the meandering electrical trace 204 are mechanically strained, causing one or more measurable electrical properties (e.g., resistance, inductance, reactance, capacitance, and so on) of the trace to change.

The meandering electrical trace 204 is typically formed from an optically transparent material, but this may not be required of all embodiments. In some cases, the meandering electrical trace 204 is formed from, without limitation: nickel, constantan, karma, silicon, polysilicon, gallium alloys, isoelastic alloys, indium-tin oxide, carbon nanoparticle composites, carbon nanotube composites, and so on.

The meandering electrical trace 204 can be deposited or disposed onto the shared layer 202 using a suitable deposition technique such as, but not limited to: vapor deposition, printing, roll-to-roll processing, gravure, pick and place, adhesive, mask-and-etch, and so on.

The shared layer 202 can be configured to flex in a free, controlled, or limited manner. For example, the shared layer 202 may be supported along its perimeter by a chassis or frame. The shared layer 202 may be single layer or multilayer including materials such as, but not limited to: plastic, metal, ceramic, glass, polyamide, polyethylene terephthalate, or any combination thereof. The shared layer 202 may have any suitable thickness, but in many embodiments, the shared layer 202 is less than 1.0 mm thick. In further embodiments, the shared layer 202 may be several microns thick. It is appreciated that the embodiment depicted is not drawn to scale.

The shared layer 202 can be transparent, translucent, or opaque. Typically the shared layer 202 is entirely electrically insulating, although this may not be required of all embodiments. The shared layer 202 may be partially or entirely electrically isolated, biased to a specific voltage, floating, or grounded. The shared layer 202 may be a polymer layer with high thermal conductivity. The thermal conductivity of the polymer layer can be adjusted and/or tuned by doping the polymer with thermally conductive particles, such as boron nitride or glass particles, and the like.

In many embodiments, such as depicted in FIG. 2B (a detailed view of the enclosed circle A-A of FIG. 2A), the meandering electrical trace 204 traverse areas between individual display components or parts that are also accommodated on the shared layer 202 of the display stack. Display components can include, but may not be limited to: pixels; subpixels; cathodes, anodes, or leads of pixels or subpixels; thin-film transistors; and so on. In the depicted embodiment, sections of the meandering electrical trace 204 traverse a region between rows of pixels. For example, a section 206 of the meandering electrical trace 204 follows a path between a first row of pixels and a second row of pixels.

Figure 3A:
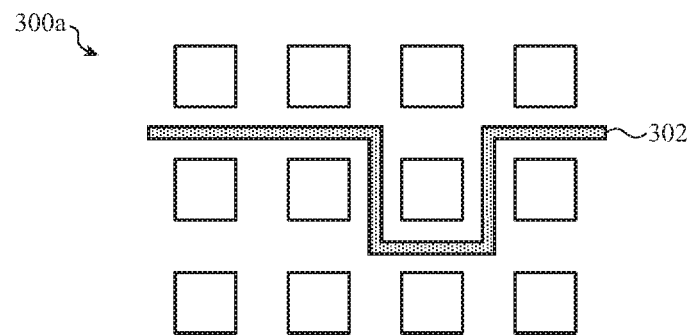
FIG. 3A depicts a simplified view of an example strain-sensitive electrical trace traversing a region between individual pixels of a display, such as described herein.

In other cases, such as depicted in FIG. 3A, a meandering electrical trace can divert around individual display components that are also accommodated on the shared layer of the display stack. In this embodiment, the shared layer is identified as the shared layer 300a and the meandering electrical trace is identified as the meandering electrical trace 302. In the depicted embodiment, sections of the meandering electrical trace 302 traverse a region between rows of pixels, diverting around a single pixel. In this example, the diversion increases the length of the meandering electrical trace 302 to increase resistance or to increase inductance.

Figure 3B:
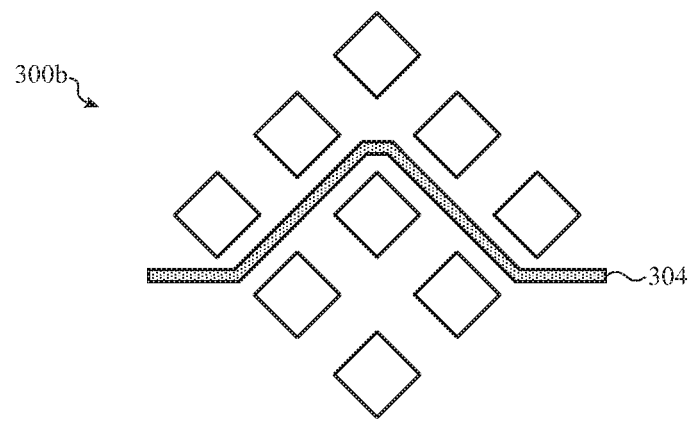
FIG. 3B depicts a simplified view of another example strain-sensitive electrical trace traversing a region between individual pixels of a display, such as described herein.

In still other cases, such as depicted in FIG. 3B, a meandering electrical trace can divert around multiple display components that are also accommodated on the shared layer of the display stack. In this embodiment, the shared layer is identified as the shared layer 300b and the meandering electrical trace is identified as the meandering electrical trace 304. In the depicted embodiment, sections of the meandering electrical trace 304 trace a generally horizontal path through a set of pixels or subpixels oriented at an angle relative to the meandering electrical trace 304. In this example, the diversion increases the length of the meandering electrical trace 304 to increase resistance or to increase inductance.

Figure 3C:
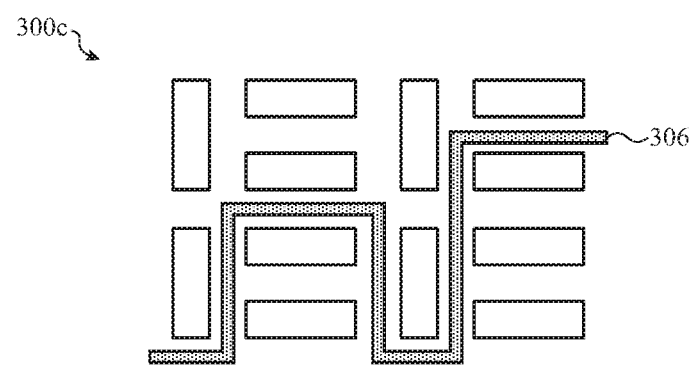
FIG. 3C depicts a simplified view of another example strain-sensitive electrical trace traversing a region between individual pixels and sub-pixels of a display, such as described herein.

In yet another embodiment, such as depicted in FIG. 3C, a meandering electrical trace can divert around multiple display subcomponents that are also accommodated on the shared layer of the display stack. In this embodiment, the shared layer is identified as the shared layer 300c and the meandering electrical trace is identified as the meandering electrical trace 306. In the depicted embodiment, sections of the meandering electrical trace 306 trace a generally horizontal path through a set of subpixels. In this example, the diversion increases the length of the meandering electrical trace 306 to increase resistance or to increase inductance.

It may be appreciated that the foregoing description of FIGS. 2A-3C, and various alternatives thereof and variations thereto are presented, generally, for purposes of explanation, and to facilitate a thorough understanding of various possible configurations of a strain-sensitive structure, disposed onto a layer of a display stack as a meandering electrical trace that can include one or more diversions to increase its length, of a force input sensor as contemplated herein. However, it will be apparent to one skilled in the art that some of the specific details presented herein may not be required in order to practice a particular described embodiment, or an equivalent thereof.

Thus, the foregoing and following descriptions and specific embodiments are understood to be presented for the limited purposes of illustration and description. These descriptions are not targeted to be exhaustive or to limit the disclosure to the precise forms recited herein. To the contrary, it will be apparent to one of ordinary skill in the art that many modifications and variations are possible in view of the above teachings. Particularly, it may be understood that the meandering electrical traces depicted in FIGS. 2A-3C can be implemented in a number of suitable ways.

Independent of the particular implementation selected for a strain-sensitive structure, it may be appreciated that the associated force input sensor may, generally and broadly, include drive circuitry, sense circuitry, and (optionally) a state controller, each of which may be coupled to an input lead and/or an output lead of the selected strain-sensitive structure. Such an implementation is depicted in FIG. 4.

Figure 4:
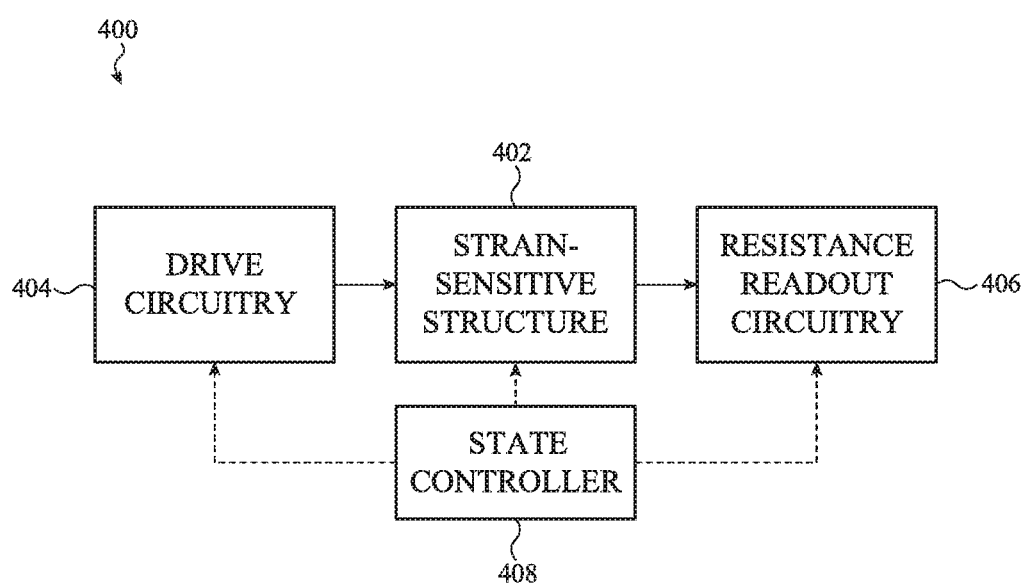
FIG. 4 depicts a simplified system diagram of a resistance-based force input sensor, such as described herein.

In particular, FIG. 4 depicts a simplified system diagram of a resistance-based force input sensor, such as described herein. The force input sensor 400 includes a strain-sensitive structure 402, a drive circuit 406, a sense circuit 406. Optionally, the force input sensor 400 can also include a state controller 408.

As noted above, the drive circuit 406 maybe configured to apply a drive signal to an input lead of the strain-sensitive structure 402. The drive signal can be any suitable signal including, but not limited to, a voltage bias, a voltage signal, a current signal, and so on.

The drive circuit 406 can be implemented in any number of suitable ways. In many examples, the drive circuit 406 includes one or more signal processing stages that may be used to generate, augment, or smooth the drive signal. For example, the drive circuit 406 can include one or more of, without limitation, amplifying stages, filtering stages, multiplexing stages, digital-to-analog conversion stages, analog-to-digital conversion stages, comparison stages, feedback stages, and so on. The drive circuit 406 can be implemented with analog circuit components, digital circuit components, passive circuit components, and/or active circuit components. In some examples, the drive circuit 406 is implemented as a single integrated circuit.

Once the drive signal is applied to the strain-sensitive structure 402, an output lead of the strain-sensitive structure can be received by the sense circuit 406. The sense signal can be any suitable signal including, but not limited to, a voltage bias, a voltage signal, a current signal, and so on.

As with the drive circuit 406, the sense circuit 406 can be implemented in any number of suitable ways. In many examples, the sense circuit 406 includes one or more signal processing stages that may be used to receive, amplify, augment, or smooth the sense signal. For example, the sense circuit 406 can include one or more of, without limitation, amplifying stages, filtering stages, multiplexing stages, digital-to-analog conversion stages, analog-to-digital conversion stages, comparison stages, feedback stages, and so on. The sense circuit 406 can be implemented with analog circuit components, digital circuit components, passive circuit components, and/or active circuit components. In some examples, the sense circuit 406 is implemented as a single integrated circuit.

The state controller 408 can be optionally coupled to one or more of the drive circuit 406, the strain-sensitive structure 402, and the sense circuit 406. As noted with respect to other embodiments described herein, the state controller 408 can be configured to selectively enable or disable the drive circuit 406 and/or the sense circuit 406 when such circuitry is not required.

In this embodiment, the sense circuit 406 is configured to determine electrical resistance exhibited by the strain-sensitive structure 402. As such, the sense circuit 406 is labeled as "resistance readout circuitry" in FIG. 4. The sense circuit 406 can determine the resistance of the strain-sensitive structure 402 using any suitable technique. Once a measurement of resistance is obtained, the sense circuit 406 (or another portion, component or module of the force input sensor 400) can correlate the measurement to an amount of strain experienced by the strain-sensitive structure 402. In other cases, the sense circuit 406 (or another portion, component or module of the force input sensor 400) can correlate the measurement directly to an amount of force applied to the display stack incorporating the strain-sensitive structure 402.

The operation of correlating the measurement to either strain experienced by the strain-sensitive structure 402 and/or force experienced by the display stack (or display or protective cover) includes one or more of: calculating a relationship between resistance and strain or force; accessing a lookup table that associates resistance and strain or force; adjusting the resistance measurement based on a location of the strain-sensitive element 402 (e.g., based on a force resistivity of the display stack at that location); adjusting the resistance measurement based on temperature; adjusting the resistance measurement based on humidity; comparing the resistance measurement to a reference resistance; and so on.

In other cases, a force input sensor can be configured to measure an electrical property other than resistance, such as inductance or reactance. In these embodiments, a strain-sensitive structure may be configured in a different manner from force input sensor embodiments configured to measure resistance of a strain-sensitive structure. More specifically, a meandering electrical trace of a force input sensor configured to measure inductance may include a number of diversions configured to increase the impedance exhibited by the trace.

Figure 5A:
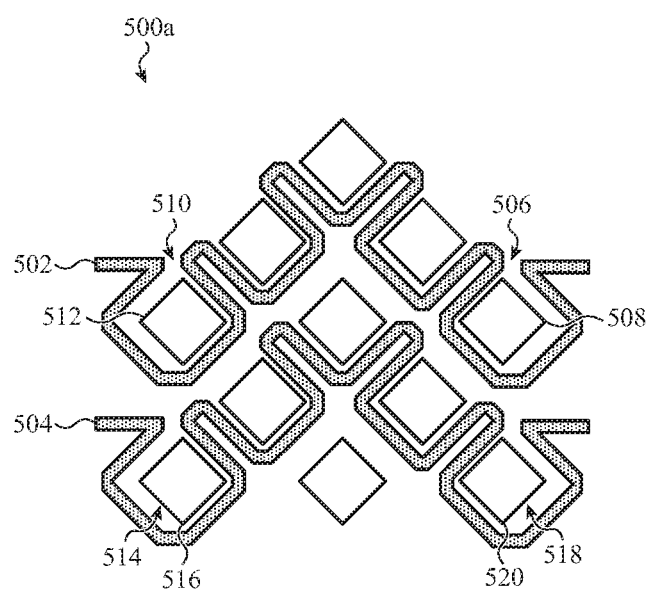
FIG. 5A depicts a simplified view of an example strain-sensitive electrical trace traversing a region between and around individual cathode or anode regions of pixels or sub-pixels of a display, such as described herein.
Figure 5B:
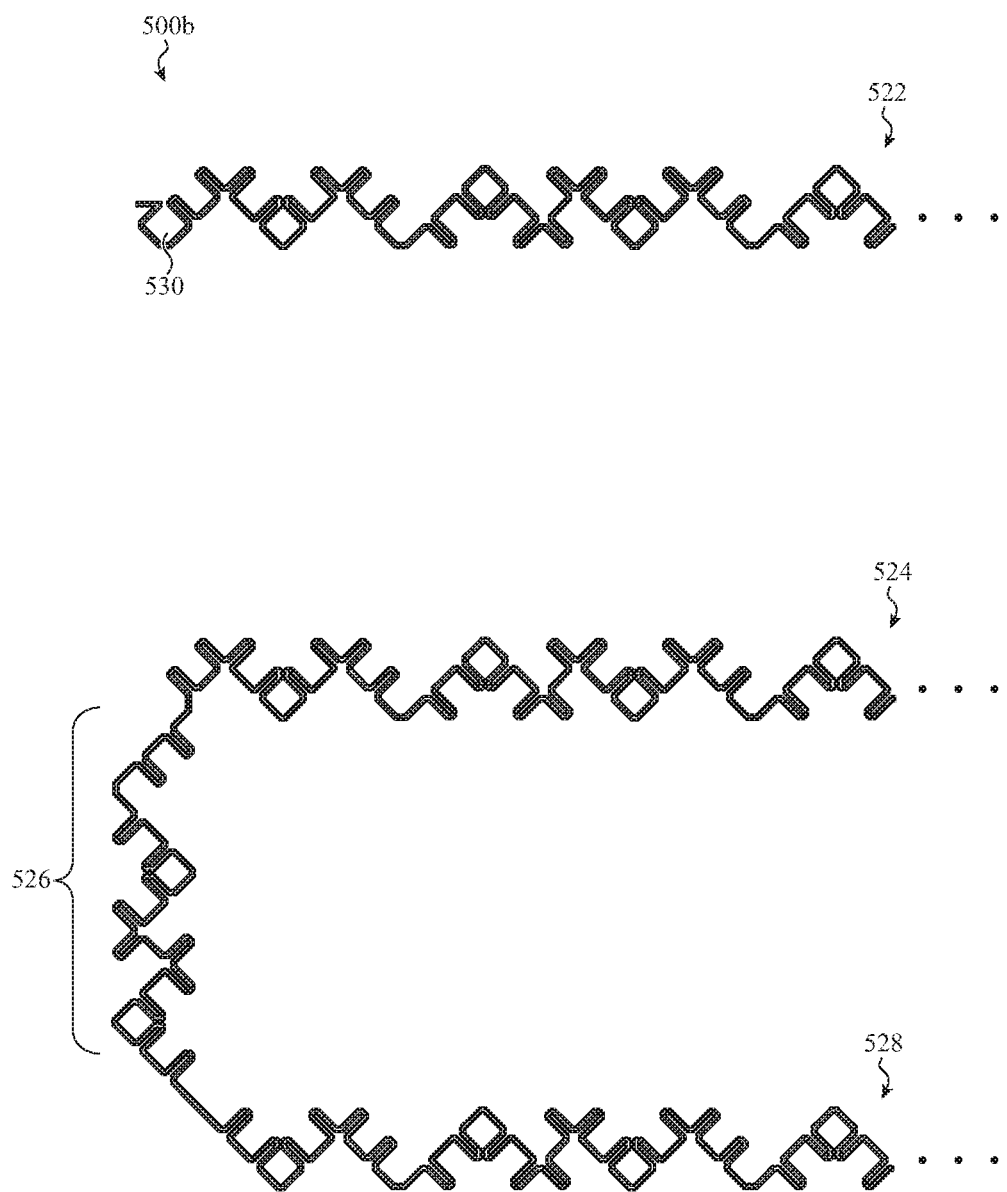
FIG. 5B depicts a simplified view of another example strain-sensitive electrical trace configured to traverse regions between and around individual cathode or anode regions of pixels or sub-pixels of a display, such as described herein.

For example, FIGS. 5A-5B depicts a detailed view of a strain-sensitive structure of an example display stack-integrated force input sensor configured to measure inductance, such as described herein. In particular, the strain-sensitive structure is formed as one or more meandering electrical traces onto a layer of the display stack 500a. Two meandering electrical traces are shown and identified as the meandering electrical trace 502 and the meandering electrical trace 504. In some embodiments, the meandering electrical trace 502 and the meandering electrical trace 504 may be electrically connected to one another, although this may not be required.

As with other embodiments described herein, the display stack 500a can be an OLED display stack and the meandering electrical trace can be disposed onto an anode layer 502 of the OLED display stack.

The anode layer 502 can include multiple anodes, each associated with a respective one pixel or subpixel. The anodes can be formed from any suitable opaque or transparent electrically conductive material. In some embodiments, the anodes can be formed from a material selected for a particular magnetic permeability, such as nickel, steel, or iron. In other cases, other metal or metallic materials can be used.

As with other embodiments described herein, when an input force is applied to the display stack 500a, the anode layer 502 and the meandering electrical trace 504 are mechanically strained, causing one or more measurable electrical properties (e.g., resistance, inductance, reactance, capacitance, and so on) of the trace to change.

The meandering electrical trace 502 and the meandering electrical trace 504 are typically formed from an optically transparent material, but this may not be required of all embodiments. In some cases, the meandering electrical trace 502 and the meandering electrical trace 504 are formed from, without limitation: nickel, constantan, karma, silicon, polysilicon, gallium alloys, isoelastic alloys, indium-tin oxide, carbon nanoparticle composites, carbon nanotube composites, and so on.

The meandering electrical traces 502, 504 can be deposited or disposed onto the anode layer 502 using a suitable deposition technique such as, but not limited to: vapor deposition, printing, roll-to-roll processing, gravure, pick and place, adhesive, mask-and-etch, and so on.

As noted above, the meandering electrical traces 502, 504 follow several diversions each configured to increase the length and/or impedance of each electrical trace. In particular, the meandering electrical trace 502 includes a diversion 506 around an anode 508. More specifically, the diversion 506 forms a loop around the anode 508, thereby increasing the inductance of the meandering electrical trace 502. In another phrasing, the diversion 506 is configured to form, with the anode 508, an inductor loop with a conductive core. Although illustrated with the anode 508 off-center with respect to the diversion 506, it may be appreciated that the relative alignment of the diversion 506 and the anode 508 may vary from embodiment to embodiment.

In addition, the meandering electrical trace 502 includes a diversion 510 around an anode 512. As with the diversion 506, the diversion 510 forms a loop around the anode 512, thereby increasing the inductance of the meandering electrical trace 502. In another phrasing, the diversion 510 is configured to form, with the anode 512, an inductor loop with a conductive core. As noted with respect to the diversion 506, although the anode 512 off-center with respect to the diversion 510, it may be appreciated that the relative alignment of the diversion 510 and the anode 512 may vary from embodiment to embodiment.

In this manner, the diversion 506 and the diversion 510 define two one-turn inductors in series, thereby increasing the inductance of the meandering electrical trace 502.

In addition to the diversion 506 and the diversion 510, the meandering electrical trace 502 can also include other diversions configured to increase the length and/or inductance of the meandering electrical trace 502. For example, four double-back diversions are depicted in FIG. 5A, each of which traverses an area between adjacent anodes and doubles back upon itself before continuing.

Similarly, the meandering electrical trace 504 includes a diversion 514 around an anode 516. The meandering electrical trace 504 also includes a diversion 518 around an anode 520. In this manner, the diversion 514 and the diversion 518 define two one-turn inductors in series, thereby increasing the inductance of the meandering electrical trace 504.

As with the meandering electrical trace 502, the meandering electrical trace 504 can also include other diversions configured to increase the length and/or inductance of the meandering electrical trace 504. For example, four double-back diversions are depicted in FIG. 5A, each of which traverses an area between adjacent anodes and doubles back upon itself before continuing.

In other embodiments, a meandering electrical trace can include many more diversion, some of which may be configured to primarily increase the length of the meandering electrical trace and some of which may be configured to primarily increase the inductance of the meandering electrical trace. For example, FIG. 5B shows a portion of a meandering electrical trace 500b that follows a generally serpentine path including the path segments 522, 524, 526 and 528. Each path segment can include a number of diversions some of which may be configured to increase the length of the meandering electrical trace 500b and some of which can be configured to increase the inductance of the meandering electrical trace 500b. In particular, fifteen inductor loop diversions are shown, one of which is labeled as the inductor loop/diversion 530.

Figure 6:
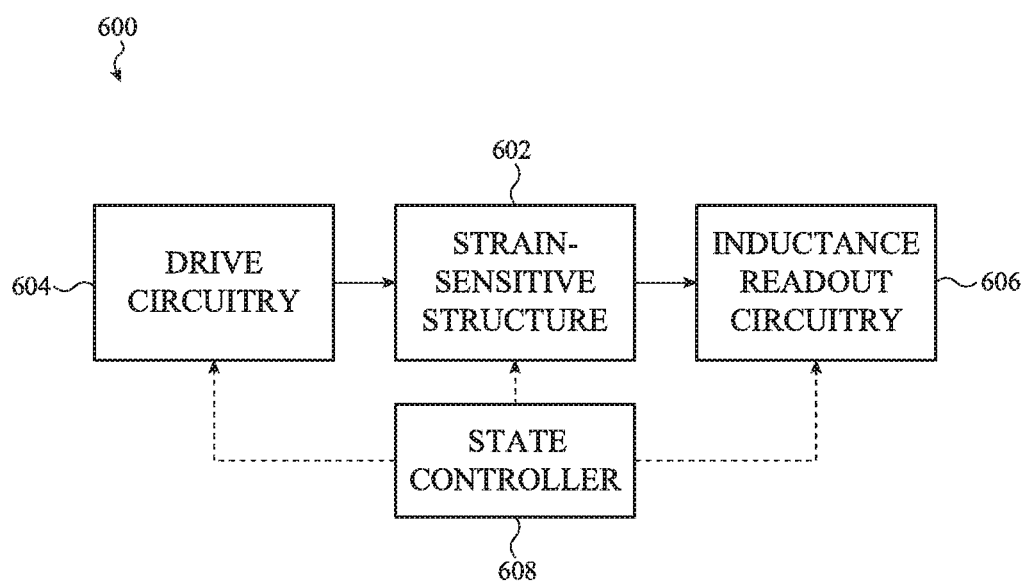
FIG. 6 depicts a simplified system diagram of an inductance-based force input sensor, such as described herein.

FIG. 6 depicts a simplified system diagram of an inductance-based force input sensor, such as described herein. The force input sensor 600 includes a strain-sensitive structure 602, a drive circuit 606, a sense circuit 606. Optionally, the force input sensor 600 can also include a state controller 608.

As noted with respect to other embodiments described herein, the drive circuit 606 maybe configured to apply a drive signal to an input lead of the strain-sensitive structure 602. The drive signal can be any suitable signal including, but not limited to, a voltage bias, a voltage signal, a current signal, and so on.

The drive circuit 606 can be implemented in any number of suitable ways. In many examples, the drive circuit 606 includes one or more signal processing stages that may be used to generate, augment, or smooth the drive signal. For example, the drive circuit 606 can include one or more of, without limitation, amplifying stages, filtering stages, multiplexing stages, digital-to-analog conversion stages, analog-to-digital conversion stages, comparison stages, feedback stages, and so on. The drive circuit 606 can be implemented with analog circuit components, digital circuit components, passive circuit components, and/or active circuit components. In some examples, the drive circuit 606 is implemented as a single integrated circuit.

Once the drive signal is applied to the strain-sensitive structure 602, an output lead of the strain-sensitive structure can be received by the sense circuit 606. The sense signal can be any suitable signal including, but not limited to, a voltage bias, a voltage signal, a current signal, and so on.

As with the drive circuit 606, the sense circuit 606 can be implemented in any number of suitable ways. In many examples, the sense circuit 606 includes one or more signal processing stages that may be used to receive, amplify, augment, or smooth the sense signal. For example, the sense circuit 606 can include one or more of, without limitation, amplifying stages, filtering stages, multiplexing stages, digital-to-analog conversion stages, analog-to-digital conversion stages, comparison stages, feedback stages, and so on. The sense circuit 606 can be implemented with analog circuit components, digital circuit components, passive circuit components, and/or active circuit components. In some examples, the sense circuit 606 is implemented as a single integrated circuit.

In this embodiment, the sense circuit 606 is configured to determine electrical inductance exhibited by the strain-sensitive structure 602. As such, the sense circuit 606 is labeled as "inductance readout circuitry" in FIG. 4. The sense circuit 606 can determine the inductance of the strain-sensitive structure 602 using any suitable technique. Once a measurement of inductance is obtained, the sense circuit 606 (or another portion, component or module of the force input sensor 600) can correlate the measurement to an amount of strain experienced by the strain-sensitive structure 602. In other cases, the sense circuit 606 (or another portion, component or module of the force input sensor 600) can correlate the measurement directly to an amount of force applied to the display stack incorporating the strain-sensitive structure 602.

The operation of correlating the measurement to either strain experienced by the strain-sensitive structure 602 and/or force experienced by the display stack (or display or protective cover) includes one or more of: calculating a relationship between inductance and strain or force; accessing a lookup table that associates inductance and strain or force; adjusting the inductance measurement based on a location of the strain-sensitive element 602 (e.g., based on a force resistivity of the display stack at that location); adjusting the inductance measurement based on temperature; adjusting the inductance measurement based on humidity; comparing the inductance measurement to a reference inductance; and so on.

In this embodiment, the state controller 608 can be optionally coupled to one or more of the drive circuit 606, the strain-sensitive structure 602, and the sense circuit 606. As noted with respect to other embodiments described herein, the state controller 608 can be configured to selectively enable or disable the drive circuit 606 and/or the sense circuit 606 when such circuitry is not required. In many cases, the state controller 608 can be configured to enable the drive circuit 604 and/or the sense circuit 606 during a refresh period of the display. In another phrasing, the state controller 608 can wait until pixels adjacent to the strain-sensitive structure 602 are off and/or floating before enabling the drive circuit 604 and/or the sense circuit 606 to obtain an inductance measurement.

It may be appreciated that the foregoing description of FIGS. 5B-6, and various alternatives thereof and variations thereto are presented, generally, for purposes of explanation, and to facilitate a thorough understanding of various possible configurations of a strain-sensitive structure, disposed onto a layer of a display stack as a meandering electrical trace that can include one or more diversions to increase its length, of a force input sensor configured to measure inductance as contemplated herein. However, it will be apparent to one skilled in the art that some of the specific details presented herein may not be required in order to practice a particular described embodiment, or an equivalent thereof.

Thus, the foregoing and following descriptions and specific embodiments are understood to be presented for the limited purposes of illustration and description. These descriptions are not targeted to be exhaustive or to limit the disclosure to the precise forms recited herein. To the contrary, it will be apparent to one of ordinary skill in the art that many modifications and variations are possible in view of the above teachings.

Figure 7:
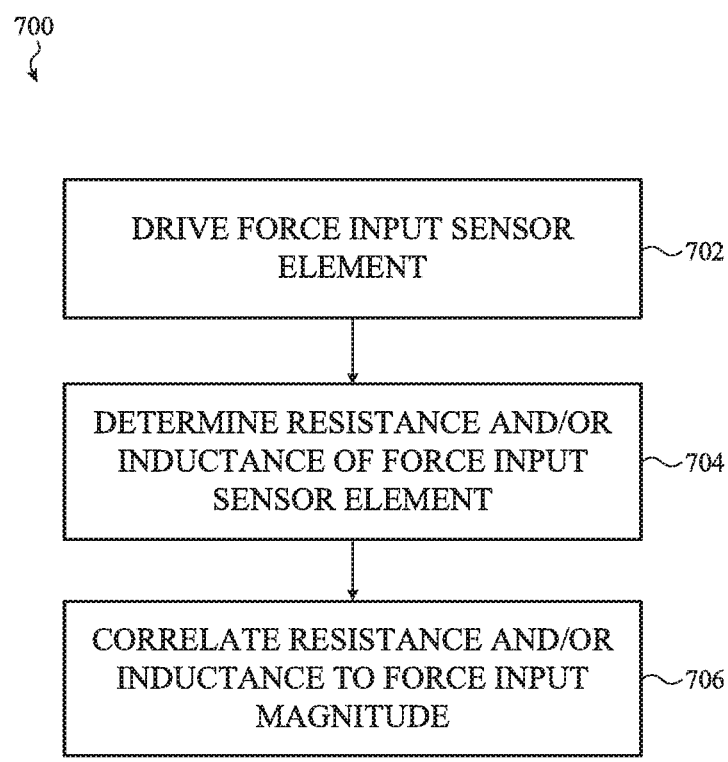
FIG. 7 is a simplified flow chart depicting example operations of a method of operating a force input sensor.
Figure 8:
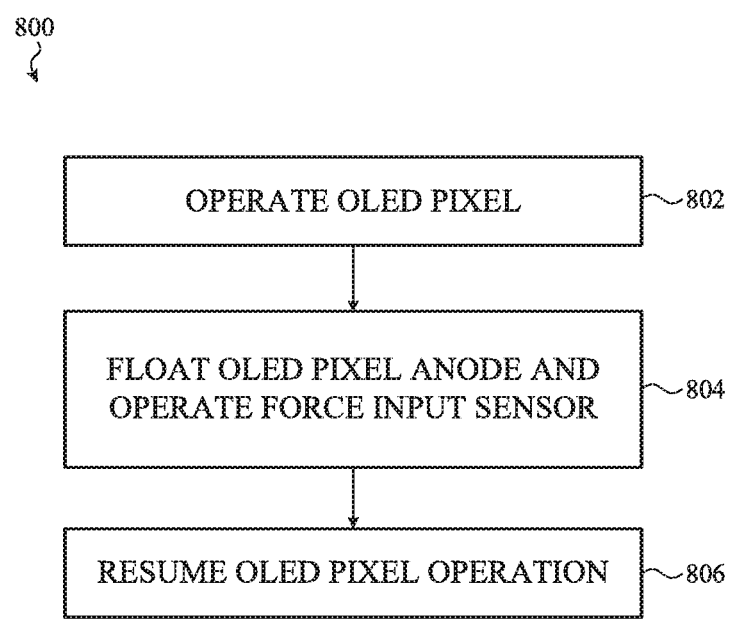
FIG. 8 is a simplified flow chart depicting example operations of a method of operating a display stack-integrated force input sensor.
Figure 9:
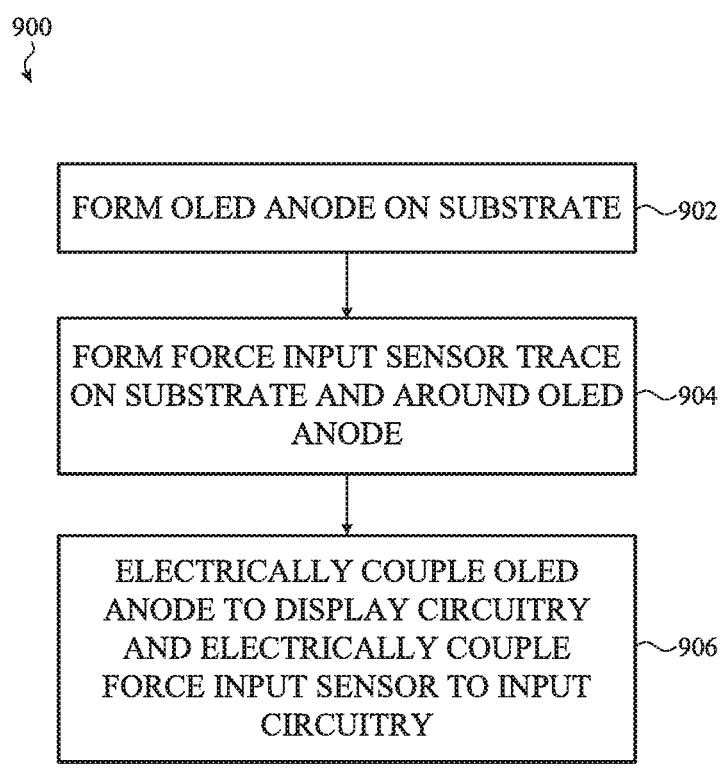
FIG. 9 is a simplified flow chart depicting example operations of a method of manufacturing a display stack-integrated force input sensor.

Generally and broadly, FIGS. 7-9 depict simplified flow charts that correspond to various methods that may be associated with a force sensor integrated into a display stack, such as described above.

In particular, FIG. 7 is a simplified flow chart depicting example operations of a method of operating a force input sensor integrated into a display stack. The method 700 includes operation 702 in which an element of a force input sensor, such as a strain-sensitive element, receives a drive signal. At operation 704, a resistance and/or an inductance exhibited by the element can be determined. At operation 706, the measurement can be correlated to a magnitude of force input applied to a display associated with the force input sensor.

FIG. 8 is a simplified flow chart depicting example operations of a method of operating pixels of a display stack-integrated force input sensor. The method 800 includes operation 802 in which an organic light-emitting diode pixel (or subpixel) is operated. At operation 804, an anode of the pixel is floated with respect to a system ground. Thereafter, the display stack-integrated force input sensor is operated. At operation 806, the pixel is re-activated.

FIG. 9 is a simplified flow chart depicting example operations of a method of manufacturing a display stack-integrated force input sensor. The method 900 includes operation 902 in which an organic light-emitting diode is anode is formed on a substrate. At operation 904, a force input sensor trace, such as a meandering trace described herein, is formed around the anode to form an inductor loop. At operation 906, the anode can be coupled to display circuitry (e.g., a thin-film transistor layer) and the force input sensor trace can be coupled to input circuitry, such as drive circuitry and/or sense circuitry.

One may appreciate that although many embodiments are disclosed above, that the operations and steps presented with respect to methods and techniques described herein are meant as exemplary and accordingly are not exhaustive. One may further appreciate that alternate step order or, fewer or additional operations may be required or desired for particular embodiments.

Although the disclosure above is described in terms of various exemplary embodiments and implementations, it should be understood that the various features, aspects and functionality described in one or more of the individual embodiments are not limited in their applicability to the particular embodiment with which they are described, but instead can be applied, alone or in various combinations, to one or more of the some embodiments of the invention, whether or not such embodiments are described and whether or not such features are presented as being a part of a described embodiment. Thus, the breadth and scope of the present invention should not be limited by any of the above-described exemplary embodiments but is instead defined by the claims herein presented.

What is claimed is:

1. An organic light-emitting diode display stack layer configured to receive a force input and comprising:
   a substrate;
   an anode disposed on the substrate; and
   an electrical trace disposed on the substrate, coplanar with the anode, and substantially circumscribing the anode, the electrical trace configured to couple to a force input sensor.

2. The organic light-emitting diode display stack layer of claim 1, wherein the anode is a member of a set of anodes disposed on the substrate.

3. The organic light-emitting diode display stack layer of claim 2, wherein:
   the anode is a first anode; and
   the set of anodes further comprises a second anode adjacent to the first anode, wherein the electrical trace substantially circumscribes the second anode.

4. The organic light-emitting diode display stack layer of claim 3, wherein the electrical trace and the first anode define a first inductor loop and the electrical trace and the second anode define a second inductor loop in series with the first inductor loop.

5. The organic light-emitting diode display stack layer of claim 2, wherein the electrical trace forms a serpentine pattern at least partially traversing the substrate adjacent to each anode of the set of anodes.

6. The organic light-emitting diode displays tack layer of claim 2, wherein the electrical trace traverses a serpentine path along the substrate.

7. The organic light-emitting diode display stack layer of claim 6, wherein the electrical trace defines a series of inductor loops, each inductor loop substantially circumscribing a respective one anode of the set of anodes.

8. The organic light-emitting diode display stack layer of claim 7, wherein the anode is formed from the same material as the electrical trace.

9. The organic light-emitting diode display stack layer of claim 1, wherein:
   the substrate is transparent; and
   the anode is formed from an optically transparent, electrically conductive material.

10. An organic light-emitting diode display configured to receive force input, the display comprising:
    a display stack comprising:
      a substrate defining an active display region of the display;
      a grid of patterned electrical traces disposed on the substrate;
      an array of pixels within the active display region, each pixel comprising:
        an anode coupled to the substrate;
        a light-emitting element coupled to the anode; and
        a cathode coupled to the light-emitting element;
          wherein each patterned electrical trace of the grid of patterned electrical traces is coplanar with at least one anode of at least one pixel and is configured to substantially circumscribe the at least one anode of the at least one pixel; and
a force input sensor coupled to each patterned electrical trace of the grid of patterned electrical traces, the force input sensor configured to correlate an electrical property of at least one patterned electrical trace to a magnitude of force applied to the display.

11. The organic light-emitting diode display of claim 10, wherein:
at least one patterned electrical trace of the grid of patterned electrical traces is configured to substantially circumscribe the anode of at least one pixel of the array of pixels, thereby defining at least one inductor loop.

12. The organic light-emitting diode display of claim 11, wherein the electrical property is inductance or reactance.

13. The organic light-emitting diode display of claim 10, wherein at least one patterned electrical trace of the grid of patterned electrical traces follows a serpentine pattern.

14. The organic light-emitting diode display of claim 10, wherein the electrical property is resistance and each patterned electrical trace of the grid of patterned electrical traces is formed from a peizoresistive material.

15. A method for detecting force input with an organic light-emitting diode display, the method comprising:
deactivating a pixel of the organic light-emitting diode display;
causing an anode of the deactivated pixel to float with respect to a system ground;
applying a drive signal to an input lead of an electrical trace at least partially circumscribing the anode of the deactivated pixel;
measuring an electrical property of the electrical trace based on a sense signal received from an output lead of the electrical trace;
correlating the measurement to a strain experienced by the electrical trace; and
correlating the strain to an input force applied to the organic light-emitting diode display.

16. The method of claim 15, wherein the electrical property is one of resistance or inductance.

17. The method of claim 15, wherein:
the electrical property is inductance; and
the drive signal comprises an alternating current component.

18. The method of claim 17, wherein measuring the electrical property comprises determining a phase difference between the drive signal and the sense signal.

19. The method of claim 15, wherein correlating the measurement to the strain comprises accessing a relational database.

20. The method of claim 15, wherein the anode comprises a ferromagnetic material.

* * * * *